HIGH FREQUENCY HARMONIC GENERATOR EMPLOYING TRANSISTOR

Filed June 5, 1958

INVENTORS,
FRANK A. BRAND &
GEORGE E. HAMBLETON.
BY
Harry M. Saragovitz
ATTORNEY.

United States Patent Office 2,926,312
Patented Feb. 23, 1960

2,926,312

HIGH FREQUENCY HARMONIC GENERATOR EMPLOYING TRANSISTOR

Frank A. Brand, West Long Branch, and George E. Hambleton, Wall Township, Monmouth County, N.J., assignors to the United States of America as represented by the Secretary of the Army Application June 5, 1958, Serial No. 740,171

4 Claims. (Cl. 331—77)

Figure 1:
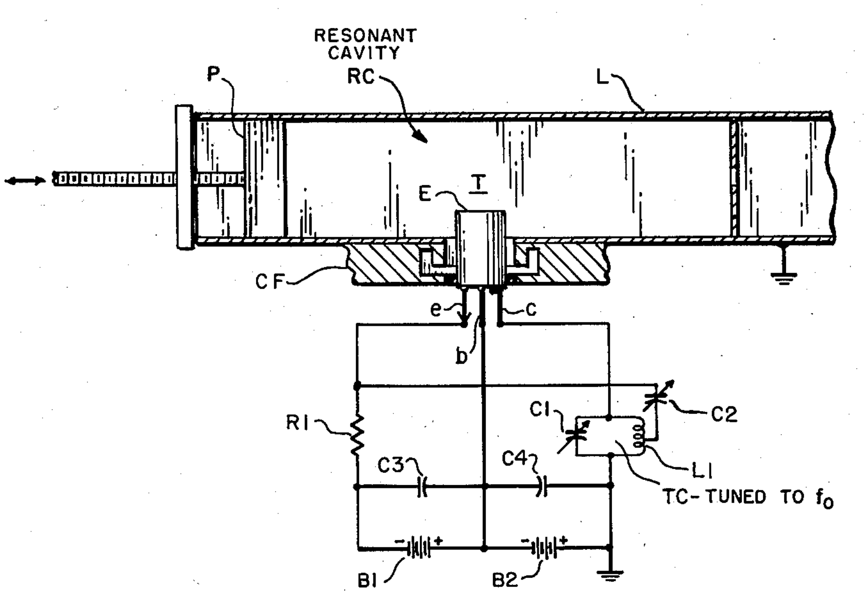

(Granted under Title 35, U.S. Code (1952), sec. 266)

The invention described herein may be manufactured and used by or for the Government for governmental purposes, without the payment of any royalty thereon.

The invention relates to wave generation and particularly to the production of electromagnetic waves in a high frequency range, such as ultra-high frequency waves or microwaves, using the process of harmonic generation.

In the past, the harmonic generators provided for such a purpose have been relatively expensive requiring the use of vacuum tubes of special design, such as klystrons, and relatively complex circuitry occupying substantial space.

The invention is more specifically directed to a harmonic generator formed from an oscillator circuit employing a so-called "transistor" device as the main oscillation element, which in the most common form employs a block of semiconductive material, such as germanium or silicon containing lattice imperfections, and provided on one of its surfaces with two closely-adjacent terminals respectively termed the emitter and collector electrode, and with a third terminal termed the base electrode which in an amplifier circuit is connected in circuit with both the emitter and the collector electrodes, and may be operated at ground or reference potential. It is known that a negative resistance effect may be attained in such a transistor circuit including current gain greater than unity, and that oscillations may be produced therein by sufficiently decreasing the impedance in the emitter and/or collector circuit, or by sufficiently increasing the impedance in the base circuit. An output circuit for a transistor circuit utilized as an oscillator may be in the form of a parallel-resonant circuit connected at one terminal directly to the transistor electrode used as the output electrode, such as the collector, and at the other terminal by a coupling and by-pass capacitor to ground or a reference voltage point, and the frequency of the oscillator is primarily determined by the adjustment of the tuning of this parallel-resonant circuit.

The semiconducting element and the associated electrodes of a transistor are usually contained within a metal envelope or can, the usual function of which is to provide shielding of the transistor from external disturbing elements tending to interfere with its proper operation.

A general object of the invention is to improve harmonic generating equipment from the standpoints of reduction in cost and space requirements and simplification of circuitry.

A related object is to generate efficiently and economically waves in the ultra-high and microwave frequency range as harmonics of a given fundamental frequency.

A more specific object is to modify a known transistor oscillator circuit to make it operative to produce waves of ultra-high or microwave frequencies which are harmonics of the fundamental frequency to which the oscillator is tuned.

In accordance with the invention, the applicants have discovered that with relatively simple modifications a conventional radio frequency oscillator employing as the main oscillation-producing element a transistor with base, emitter and collector electrodes and capable of oscillation in the ultra-high frequency range, may be made to operate as a harmonic generator to generate high frequency harmonics, including those of ultra-high and microwave frequencies, of the fundamental frequency to which the oscillator is tuned, with a substantial amount of power in each generated harmonic. These modifications include the direct connection of the particular transistor electrode used as the output electrode and connected to the tuned output tank circuit of the oscillator, to the metal envelope or can containing the transistor elements and the connection of the base lead of the transistor to rf ground, so that this envelope, which is maintained insulated from ground, forms an integral part of the oscillator output circuit and operates effectively as an antenna for the high frequency harmonics of the fundamental frequency to which the oscillator is tuned; and the insertion of the transistor and the surrounding metal envelope through a choke filter into the interior of a resonant cavity formed in a section of hollow-pipe waveguide line and tuned to the desired harmonic frequency within the UHF or microwave frequency range by any suitable means, which may include adjustment of the position of a sliding short-circuiting plunger at one end of the cavity, to enable the selection, propagation and utilization of the generated harmonics.

Figure 2:
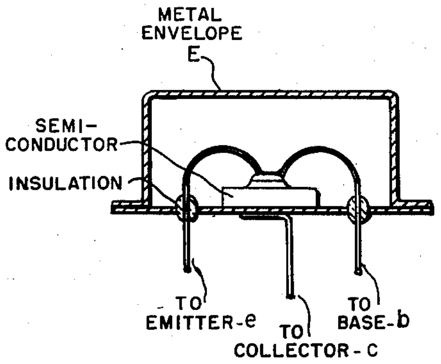

The various objects and features of the invention will be better understood from the following complete description of one embodiment thereof when it is read in connection with the accompanying drawing in which:

Fig. 1 shows a front view, partly in section, of one harmonic generator in accordance with the invention utilizing a conventional transistor oscillator circuit shown schematically; and Fig. 2 shows an enlarged cross-sectional view of the metal envelope or can containing the transistor, used in the harmonic generator of Fig. 1, indicating the internal transistor structure and connections utilized to provide the desired harmonic generator action.

Referring to Fig. 1, the oscillator shown therein is of the conventional Hartley type but employing a junction transistor in a grounded base or (more accurately) a common base configuration, in the place of the usual vacuum tube and associated circuits. In the circuit shown, the high frequency junction transistor T comprising a semiconductor body and the usual associated base electrode *b*, emitter electrode *e* and collector electrode *c* contained within the metal envelope or can E, is of the N–P–N type as indicated conventionally by the direction of the arrow associated with the emitter electrode. As shown, the emitter-base electrode circuit includes a suitable poled battery B1 for negatively biasing the emitter electrode *e* with respect to the base electrode *b* through the series high frequency choke resistor R1, and the collector-base circuit includes a properly poled battery B2 for positively biasing the collector electrode *c* with respect to the base electrode *b* through the parallel-resonant tank circuit TC including the tapped inductor or autotransformer L1 and the variable capacitor C1 in parallel therewith. The tank circuit TC by suitable adjustment of the variable capacitor C1 or autotransformer L1, or both, is tuned to a desired frequency $f_0$. A variable capacitor C2 is connected between the tapped point on the autotransformer L1 and the emitter electrode *e* to provide means for varying the amount of feedback between the tank circuit and the emitter-base circuit of the oscillator. The lower end of the tuned circuit TC is connected to ground. The blocking capacitors C3 and C4 respectively connected across the batteries B1 and B2 provide means for passing radio frequency energy between the base electrode $b$ and the emitter $e$ and collector $c$, respectively.

As shown in Fig. 2, the collector side of the semiconductor of the transistor T is actually soldered directly to the envelope or can E, while the leads to the emitter $e$ and base $b$ of the transistor are insulated from the envelope E. As shown in Fig. 1, the transistor T and surrounding metal envelope E so constructed are inserted into the interior of a suitably designed resonant cavity RC formed in a section of hollow-pipe waveguide line L through a known "groove" type of mechanical choke filter CF, the transistor envelope E being effectively insulated, as shown, from the wall of the waveguide line L which is grounded as shown, and the sides of the choke filter CF. Because of the direct connection of the collector $c$ to the envelope E and the effective connection of the lead of the base electrode $b$ to rf ground, the envelope E forms an integral part of the oscillator output circuit and will act as an antenna for generating high frequency harmonics of the fundamental frequency of the oscillator. These harmonics will be transmitted through the choke filter CF provided to prevent leakage at ultra-high and microwave frequencies, to the resonant cavity RC which is tunable to any desired harmonic frequency in this range by proper positioning of the short-circuiting plunger P on one end of the resonant cavity RC.

Preliminary experiments made on the above-described circuit at frequencies in the order of 300 mc./s. using developmental transistors indicated that fairly strong harmonic generation could be obtained at ultra-high and microwave frequencies. For example, when the above-described oscillator circuit was tuned to oscillate at a fundamental frequency of about 320 megacycles per second, the results noted showed that at microwave frequencies a power output of several milliwatts might be obtained. In particular, harmonic power output was noted at frequencies as high as 3400 mc./s. If the transistor oscillator were to oscillate at a fundamental frequency of about 300 megacycles per second with a power output of 30 milliwatts, the fifth harmonic (1500 mc./s.) could have a power output in the neighborhood of 6 milliwatts.

A suitable assembly of the harmonic generating circuit in accordance with the invention, for example, such as illustrated in Figs. 1 and 2, might find application in a local oscillator replacing a klystron in conventional radar receivers.

Although the harmonic generator of the invention has been illustrated and described above as employing a transistor oscillator of the Hartley type and utilizing a junction type transistor in a circuit of the grounded or common base configuration, it is also applicable to transistor oscillator circuits of the Colpitts or other types employing other circuit configurations, such as the grounded emitter or grounded collector configuration, provided the electrode which is tied to the metal envelope of the transistor is the electrode used for connection to the output tank circuit.

The applicants are not entirely certain as to the precise mechanism in the modified transistor oscillator circuit which results in the generation of such high frequency harmonics directly from the transistor, indicated by the experiments which have been made by them, although it is believed that certain unique features of the transistors per se, such as variable non-linear capacitive effects at the collector electrode, might be responsible for the generation of very high frequency harmonics with good efficiency.

Various modifications of the circuits illustrated and described which are within the spirit and scope of the invention will occur to persons skilled in the art.

What is claimed is:

1. A harmonic generator comprising in combination with an oscillator including a transistor capable of oscillation in the ultra-high frequency range, consisting of a semiconductor body and associated base, emitter and collector electrodes, said electrodes being relatively biased and interconnected to form the oscillator circuit with a parallel-resonant output tank circuit connected in circuit with the particular transistor electrode used as the output electrode, the particular frequency of oscillation of said oscillator being primarily determined by the tuning of said tank circuit, a metal envelope enclosing said transistor and directly connected to said output transistor electrode so that it forms an integral part of the oscillator output and operates effectively as an antenna to generate the high frequency harmonics of said particular frequency when said oscillator is operatively energized, and means for taking off the generated harmonics from said envelope acting as an antenna and for selectively propagating desired ones of the generated harmonics.

2. The harmonic generator of claim 1, in which the collector electrode of said transistor is the output electrode in said oscillator circuit, which is connected in circuit with said parallel-resonant tank circuit, and is soldered directly to the base of said envelope, the leads to said base and emitter electrodes of said transistor in said oscillator circuit are insulated from said envelope, and said base electrode of said transistor in connected effectively to radio frequency ground in said oscillator circuit and with the direct connection of the collector electrode to said envelope enables said envelope to act as an antenna for the generated harmonics.

3. The harmonic generator of claim 1, in which said means for taking off the generated harmonics from said metal envelope acting as an antenna and for selectively propagating desired ones of said harmonics, includes a resonant cavity formed in a section of hollow-pipe waveguide line and a choke filter, said envelope and the enclosed transistor being inserted through said choke filter into the interior of said cavity, and means including a sliding short-circuiting plunger in the end of said cavity for varying the length thereof to selectively tune that cavity to any desired one of the generated harmonics, which is propagated longitudinally over said waveguide.

4. The harmonic generator of claim 1, in which the harmonics generated in said oscillator when it is operatively energized and appearing in said metal envelope acting as an antenna include harmonics of microwave frequencies and are of substantial amplitude for each harmonic.

References Cited in the file of this patent

UNITED STATES PATENTS

| | | |
|---|---|---|
| 1,304,868 | Franklin | May 27, 1919 |
| 2,125,969 | Turner | Aug. 9, 1938 |
| 2,817,761 | Hollmann | Dec. 24, 1957 |

OTHER REFERENCES

Radio & TV News, May 1957, pp. 43–45, "Transistorized Ultrasonic Generator," Garner.